United States Patent
Ratnadurai et al.

(10) Patent No.: US 10,180,624 B1
(45) Date of Patent: Jan. 15, 2019

(54) SYSTEMS AND METHODS FOR FORMING CONTACT DEFINITIONS

(71) Applicants: Rudraskandan Ratnadurai, Tampa, FL (US); Subramanian Krishnan, Wesley Chapel, FL (US); Shekhar Bhansali, Tampa, FL (US)

(72) Inventors: Rudraskandan Ratnadurai, Tampa, FL (US); Subramanian Krishnan, Wesley Chapel, FL (US); Shekhar Bhansali, Tampa, FL (US)

(73) Assignee: University of South Florida, Tampa, FL (US)

(\*) Notice: Subject to any disclaimer, the term of this patent is extended or adjusted under 35 U.S.C. 154(b) by 0 days.

(21) Appl. No.: 15/719,998

(22) Filed: Sep. 29, 2017

Related U.S. Application Data

(62) Division of application No. 15/084,775, filed on Mar. 30, 2016, now Pat. No. 9,804,491, which is a division
(Continued)

(51) Int. Cl.
*H01L 29/40* (2006.01)
*G03F 7/00* (2006.01)
(Continued)

(52) U.S. Cl.
CPC .............. *G03F 7/0035* (2013.01); *G03F 1/42* (2013.01); *H01L 28/20* (2013.01); *H01L 28/40* (2013.01); *H01L 29/861* (2013.01)

(58) Field of Classification Search
CPC ....... H01L 2924/00; H01L 2924/00014; H01L 2224/48091; H01L 2224/45015; H01L 2224/32225; H01L 2924/00012; H01L 2224/48227; H01L 2224/73265; H01L 2224/45014; H01L 2224/45144; H01L 2924/15311; H01L 2224/45124; H01L 2224/45147; G01R 1/06716; G01R 1/07307; G01R 1/0466; B81B 7/007; B81B 2207/07; B81B 2201/0235; B81B 2201/0242; B81B 2203/053; B81B 3/0018; B81B 7/0048; B81B 7/0058;
(Continued)

(56) References Cited

U.S. PATENT DOCUMENTS 3,370,203 A   2/1968   Kravitz et al.
3,988,824 A   11/1976  Bodway
(Continued)

*Primary Examiner* — Robert G Bachner
(74) *Attorney, Agent, or Firm* — Thomas | Horstemeyer, LLP

(57) ABSTRACT

In one embodiment, a method for fabricating thin film tunneling devices using a mask set includes depositing a first layer of material on a substrate, positioning a first photomask over the substrate, exposing the first layer to light that passes through the first photomask, depositing a second layer of material on the substrate, positioning a second photomask over the substrate by aligning a corner marker provided on the second photomask with one of multiple corner markers provided on the first photomask, wherein the corner marker of the first photomask with which the corner marker of the second photomask aligns defines a degree of overlap between a first structure formed using the first photomask and a second structure formed using the second photomask; and exposing the second layer to light that passes through the second photomask.

8 Claims, 5 Drawing Sheets

Related U.S. Application Data of application No. 14/803,380, filed on Jul. 20, 2015, now Pat. No. 9,324,565, which is a division of application No. 14/057,695, filed on Oct. 18, 2013, now Pat. No. 9,123,690.

(60) Provisional application No. 61/715,430, filed on Oct. 18, 2012.

(51) Int. Cl.
  *G03F 1/42* (2012.01)
  *H01L 29/861* (2006.01)
  *H01L 49/02* (2006.01)

(58) Field of Classification Search
  CPC .... B81B 7/0061; B81B 7/0064; H05K 1/141; H05K 1/185; H05K 2201/10568; H05K 3/3447; H05K 1/0219; H05K 1/0306; H05K 1/111; H05K 1/189; H05K 2201/0367; H05K 2201/09045; H05K 2201/09781; H05K 2201/10106; H05K 2201/10121; H05K 2201/10659; H05K 2201/10674; H05K 2201/10734; H05K 2201/2036; H05K 2203/167; H05K 3/303; H05K 3/325; H05K 3/3442; H05K 1/021; H05K 1/0216; H05K 1/023; H05K 1/0263; H05K 1/0284; H05K 1/0298; H05K 1/113; H05K 1/115; H05K 1/118; H05K 1/147; H05K 2201/0133; H05K 2201/0187; H05K 2201/0355; H05K 2201/0394; H05K 2201/049; H05K 2201/0715; H05K 2201/09036; H05K 2201/09063; H05K 2201/09081; H05K 2201/0919; H05K 2201/09236; H05K 2201/09381; H05K 2201/094; H05K 2201/09436; H05K 2201/09472; H05K 2201/09745; H05K 2201/0979; H05K 2201/09809; H05K 2201/10022; H05K 2201/10083; H05K 2201/10166; H05K 2201/10386; H05K 2201/10454; H05K 2201/10666; H05K 2201/10719; H05K 2201/10727; H05K 2201/10916; H05K 2201/10969; H05K 2203/0195; H05K 2203/0278; H05K 2203/0285; H05K 2203/0369; H05K 2203/0542; H05K 2203/082; H05K 2203/1115; H05K 2203/1147; H05K 2203/1469; H05K 2203/306; H05K 3/0052; H05K 3/0061; H05K 3/242; H05K 3/243; H05K 3/305; H05K 3/306; H05K 3/308; H05K 3/321; H05K 3/326; H05K 3/328; H05K 3/341; H05K 3/3452; H05K 3/3494; H05K 3/366; H05K 3/368; H05K 3/383; H05K 3/4007; H05K 3/403; H05K 3/429; H05K 3/4605; H05K 3/4652; H05K 3/4682; H05K 5/0047; H05K 7/1061; H05K 7/1461; H05K 7/20545; H05K 7/209; H05K 7/20927; H05K 9/0049; H05K 3/3436
  See application file for complete search history.

(56) References Cited

U.S. PATENT DOCUMENTS

| | | |
|---|---|---|
| 4,437,235 A | 3/1984 | McIver |
| 4,843,453 A | 6/1989 | Hooper et al. |
| 5,275,156 A | 1/1994 | Ettinger et al. |
| 5,358,886 A | 10/1994 | Yee et al. |
| 5,693,540 A | 12/1997 | Turner et al. |
| 7,282,440 B2 | 10/2007 | Dennison et al. |
| 7,719,120 B2 | 5/2010 | Hiatt et al. |
| 7,863,091 B2 | 1/2011 | Coteus |
| 7,951,702 B2 | 5/2011 | Wood et al. |
| 2004/0121589 A1 | 6/2004 | Pividori |
| 2007/0038100 A1 | 2/2007 | Nita |
| 2013/0345599 A1 | 12/2013 | Lin et al. |

SYSTEMS AND METHODS FOR FORMING CONTACT DEFINITIONS

CROSS-REFERENCE TO RELATED APPLICATION(S)

This application is a divisional of co-pending U.S. Non-Provisional Application entitled "Systems And Methods For Forming Contact Definitions", having Ser. No. 15/084,775, filed Mar. 30, 2016, which is a divisional of U.S. Non-Provisional Application entitled "Systems and Methods for Forming Contact Definitions", having Ser. No. 14/803,380, now U.S. Pat. No. 9,324,565, filed Jul. 20, 2015, which is a divisional of U.S. Non-Provisional Application entitled "Systems and Methods for Forming Contact Definitions", having Ser. No. 14/057,695, now U.S. Pat. No. 9,123,690, filed Oct. 18, 2013, which claims priority to U.S. Provisional Application Ser. No. 61/715,430, filed Oct. 18, 2012, all of which being hereby incorporated by reference into the present disclosure.

BACKGROUND

One of the most important aspects of chip fabrication, such as complementary metal-oxide-semiconductor (CMOS) fabrication, entails the contact definitions. In a highly complex chip design, there are many contacts to interconnect a multitude of devices within the chip. Devices such as transistors and diodes specific to a particular circuit have contacts dedicated to that circuit. Parallel and series circuits are generally made by fabricating devices specific to that circuit, and a circuit requiring the connections of the devices in a particular way is separately fabricated. If a different circuit comprising the same device types but requiring a different circuit connection is needed, a new set of devices with the required connections would have to be fabricated separately. Such a process reduces real estate in a chip and gives rise to other complications, such as reliability issues during fabrication, reliability issues during operation, and increased heat buildup in the chip.

It can therefore be appreciated that it would be desirable to have an alternative system and method for forming contact definitions.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

Figure 1:
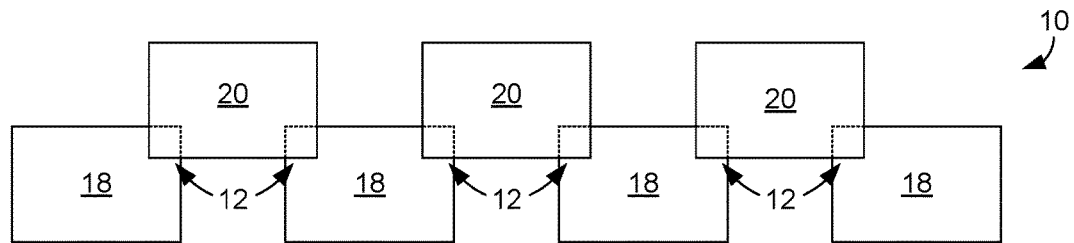
FIG. 1 is a schematic diagram of an embodiment of a circuit comprising multiple metal-insulator-metal devices.

As described above, current methods for forming contact definitions for devices on a chip can be disadvantageous because circuits for connecting the devices must be specifically fabricated for the desired circuit. Therefore, if a different circuit comprising the same device types is desired, a new set of devices with a new set of connections would need to be separately fabricated. As described herein, such disadvantages can be avoided. In some embodiments, a circuit comprising multiple metal-insulator-metal (MIM) devices can be formed by depositing layers of metal that both form the top electrodes of the MIM devices and provide interconnection of the MIM devices. In some embodiments, the extent to which the layers of metal overlap, and therefore the size of the active area, can be controlled to change one or both of the current density and the frequency range of the devices.

In the following disclosure, various embodiments are described. It is to be understood that those embodiments are example implementations of the disclosed inventions and that alternative embodiments are possible. All such embodiments are intended to fall within the scope of this disclosure.

The methods disclosed herein enable multiple MIM tunnel devices to be connected either serially or in parallel to form an electrical circuit. Moreover, the contact areas between devices can be altered by simply moving a photomask used to form the top electrodes of the devices by incremental distances. This enables the current densities of the devices to be altered without having to redesign the devices. In some embodiments, a plurality of MIM devices can be fabricated with the point of contact being defined in such a way that the devices can be used in series or in parallel with multiple variations, as desired for the test setup or circuit. Moreover, by varying the dielectric properties and/or thicknesses of the insulators, the devices can be altered to be used as a resistors, capacitors, or diodes.

Thin-film devices are now increasingly used in the fabrication of passive elements such as resistors and capacitors, and active devices such as diodes including transistors. MIM devices are widely-used thin-film devices. MIM devices typically are formed as quadrilateral structures that include a bottom electrode, an insulator, and a top electrode. The fabrication methods described below enable multiple MIM devices to be connected either serially or in parallel to complete an electrical circuit. Moreover, the contact areas between devices can be altered by simply moving the photomask used to form the top electrode. This enables the current densities of the devices to be altered without having to redesign the devices. Assuming a quadrilateral configuration, one, two, three, or four devices can be connected at any single circuit connection. Therefore a base of one, two, three, or four connection combinations can be achieved. By connecting the devices in such a manner, bottom electrodes and insulator stacks can be independently fabricated and the circuit can later be completed by forming top electrodes that connect two or more electrode/insulator stacks. Also, by including a switching element, single or multiple devices can be called into operation as needed without having to constantly pass power through the same devices.

FIG. 1 illustrates an example circuit 10 that can be formed using the techniques described above and FIG. 2 illustrates steps of an example fabrication method. In the example of FIG. 1, six MIM devices 12 are formed. As is shown in FIG.

Figure 2A:
FIGS. 2A-2D are cross-sectional views that illustrate steps in an embodiment of fabricating the circuit of FIG. 1.
Figure 2B:
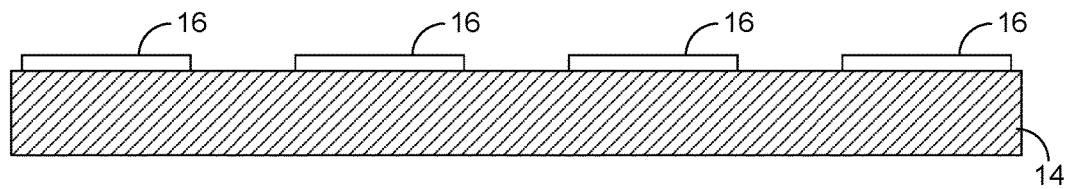

2A, the circuit 10 can be formed on a substrate 14, such as a silicon substrate. With reference to FIG. 2B, bottom electrodes 16 of the devices 12 can be formed on the substrate 14 in a spaced configuration. In some embodiments, the electrodes 16 are made of a metal material, such as nickel, aluminum, gold, or platinum, and are deposited using a conventional microfabrication process, such as photolithography and material deposition (e.g., sputtering). In some embodiments, the electrodes 16 can be approximately 0.5 to 3 μm thick.

Figure 2C:
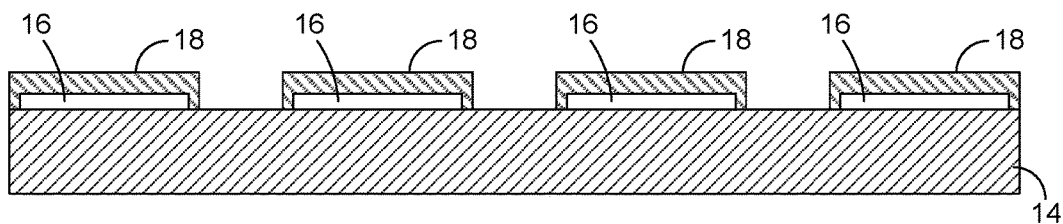

With reference next to FIG. 2C, each of the bottom electrodes 16 is encapsulated in a layer or film 18 of insulating material. In some embodiments the insulating material can comprise one or more of a metal oxide (e.g., nickel oxide or aluminum oxide) or a polymer (organic or inorganic) and can also be formed using a conventional microfabrication process. In some embodiments, the insulating films 18 can be approximately 0.001 to 1 μm thick. The insulating films 18 act as insulators in the MIM devices 12.

Figure 2D:
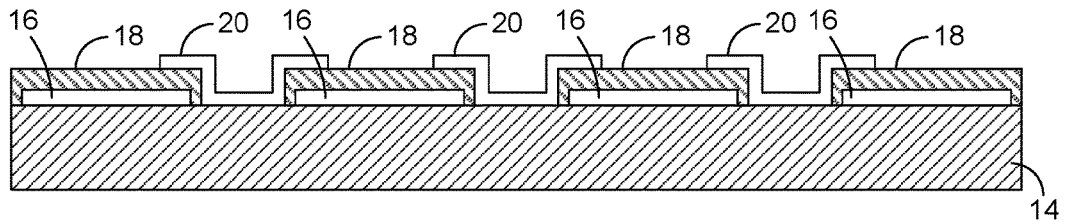

Once the bottom electrodes 16 and insulating films 18 have been formed, a photomask can be used to define windows for the top electrodes of the MIM devices 12. As with the bottom electrodes, the top electrodes can be made of a metal material, such as nickel, aluminum, gold, or platinum, and can also be formed by using a conventional microfabrication process. As shown in FIG. 2D, layers of metal 20 can be deposited on top of the insulating films 18 to form the MIM devices 12 shown in FIG. 1. In some embodiments, the metal layers 20 can be approximately 0.5 to 3 μm thick.

As indicated FIG. 2D, each metal layer 20 covers portions of the insulating films 18, and therefore overlaps bottom electrodes 16, of multiple devices 12 (two devices in this example) so that the top electrodes of multiple MIM devices are formed by the same metal layer. In other words, the deposited metal layers 20 extend across multiple MIM devices so as to both form the top electrodes of and electrically connect the MIM devices over which they extend. As is shown in FIG. 2D, the metal layers 20 also cover portions of the sides of the insulating films 18 as well as the surface of the substrate 14. In the illustrated embodiment, four metal/insulator stacks are covered by three metal layers 20 to form six MIM devices 12 that are electrically connected to each other. Therefore, multiple MIM devices can be simultaneously fabricated and interconnected in a single lithography step.

Figure 3A:
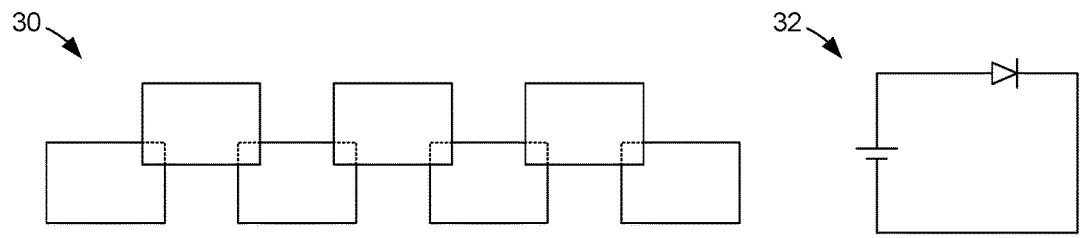
FIGS. 3A-3C are schematic diagrams of alternative circuit embodiments comprising multiple metal-insulator-metal devices.
Figure 3B:
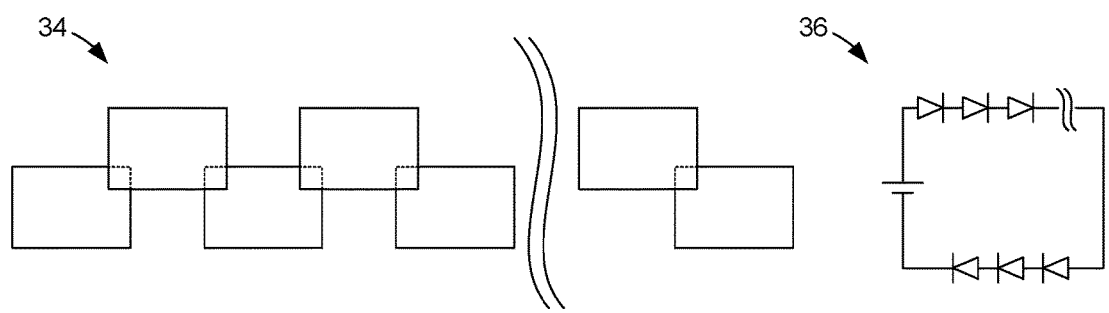
Figure 3C:
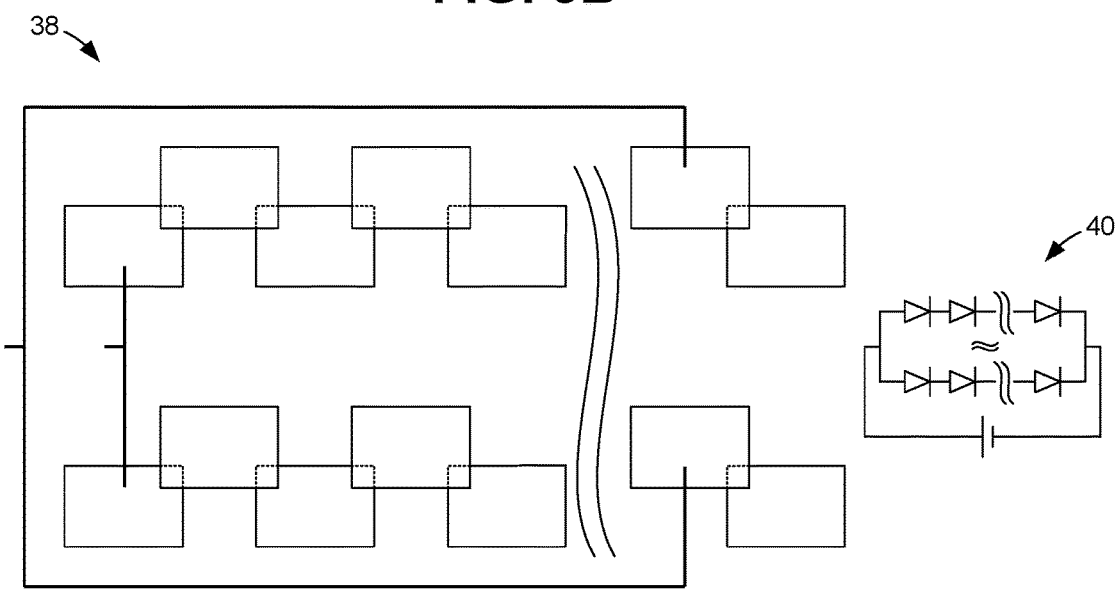

The method described above can be used to form devices that are serially connected or connected in parallel. FIGS. 3A-3C illustrate example circuit layouts 30, 34, and 38 (left) and their equivalent circuit diagrams 32, 36, and 40 (right). In the circuits, each of the devices can be MIM devices, which can be configured as resistors, capacitors, or diodes, depending upon the nature of the insulation films (e.g., dielectric properties, thickness) that is used in their construction. As can be appreciated from the layouts and circuit diagrams, a plurality of MIM devices can be connected either serially (FIGS. 3A and 3B) or in parallel (FIG. 3C) and the connections between the devices can be altered depending on the desired result.

Figure 4:
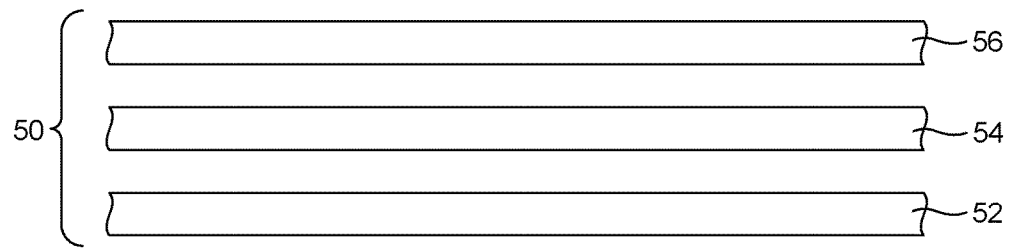
FIG. 4 is a partial side view of a mask set that can be used to fabricate a circuit.

As expressed above, the circuits can be formed using conventional microfabrication processes, such as photolithography. In such a process, photomasks are used to define the patterns of the features (e.g., electrodes) that are to be formed on a substrate. In the typical case, a mask set comprising one photomask for each layer of the devices to be formed is provided. FIG. 4 shows an example mask set 50 that comprises three photomasks, 52, 54, and 56, which can, for example, be used to form the bottom electrodes, insulating layer, and top electrodes, respectively of multiple MIM devices. Each photomask 52-56 can comprise a thin transparent (e.g., glass) plate that includes a layer of opaque material (e.g., chrome) that forms a pattern that enables ultraviolet light to pass through the plate in some areas (e.g., where an electrode is to be formed) but prevents the light from passing through the plate in other areas.

The photomasks of a mask set are typically aligned with each other using alignment marks that are provided on the photomasks. Such alignment ensures that the various features that are formed on the substrate are laterally aligned with each other in the desired manner. Such alignment marks can be used to control the amount of overlap between two layers of material. Therefore, alignment marks can be used to control the amount of overlap between bottom and top electrodes of an MIM device and, therefore, control the size of the MIM device's active area.

Figure 5:
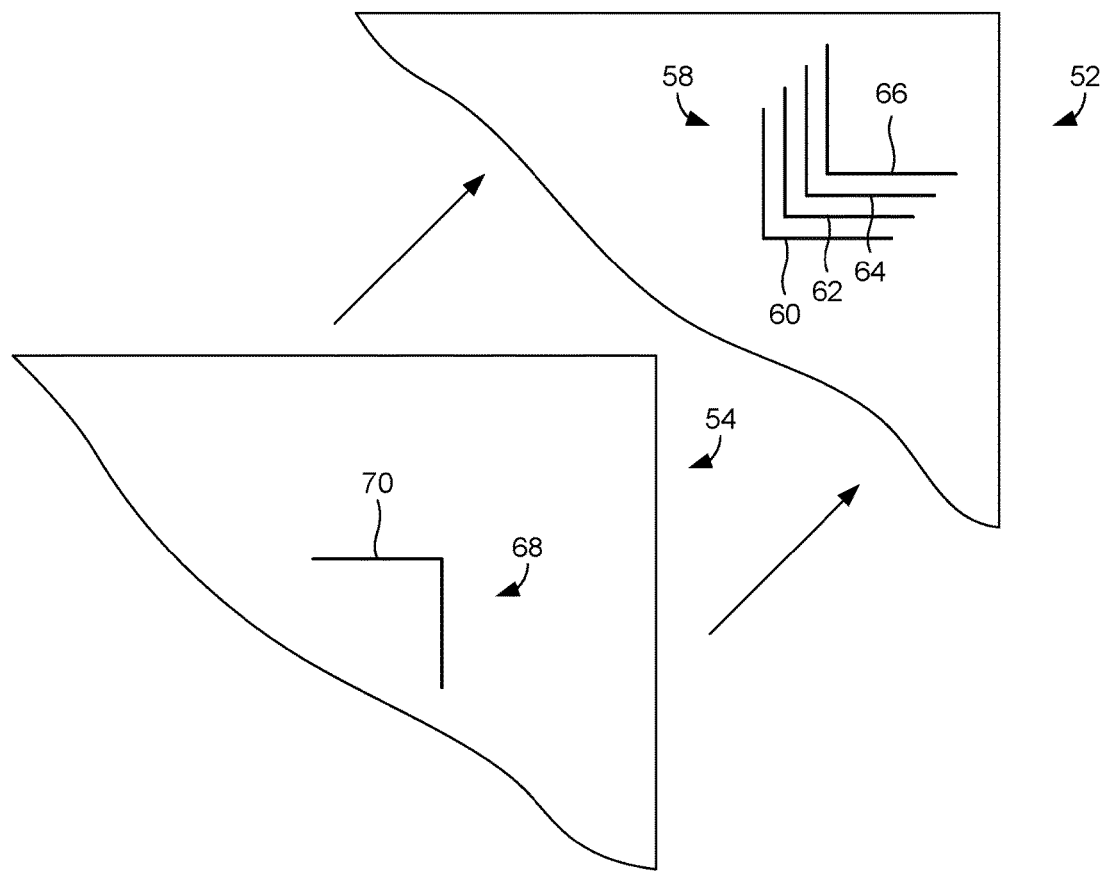
FIG. 5 is a top view of two of the masks of the mask set of FIG. 4, illustrating alignment marks provided on the masks.

FIG. 5 shows examples of alignment marks provided on two photomasks 52, 54 of the mask set 50 of FIG. 4. As shown in FIG. 5, the first photomask 52 comprises an alignment mark 58 in the form of a series of corner markers 60-66. Each corner marker 60-66 comprises a first line (x-direction line) that extends from a point and a second line (y-direction line) that extends from the same point in a direction 90° out of phase of the first line so as to define a 90° corner. In the illustrated example, there are four such corner markers 60-66, each equally spaced from its neighbor(s) along a 45° diagonal direction.

The second photomask 54 also comprises an alignment mark 68 that comprises a corner marker 70. Like the corner markers 60-66, the corner marker 70 comprises a first line that extends from a point and a second line that extends from the same point in a direction 90° out of phase of the first line so as to define a 90° corner. If the corner markers 60-66 are said to have lines that extend in the x direction and the y direction, the corner marker 70 can be said to have lines that extend in the −x direction and the −y direction so as to be rotated 180° relative to the corner markers 60-66.

Figure 6A:
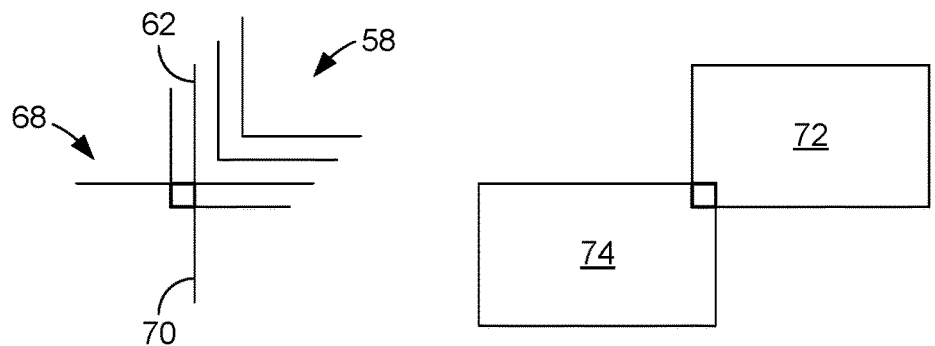
FIGS. 6A-6C are illustrations of different alignments between the masks of FIG. 5 and show the results of the alignments.
Figure 6B:
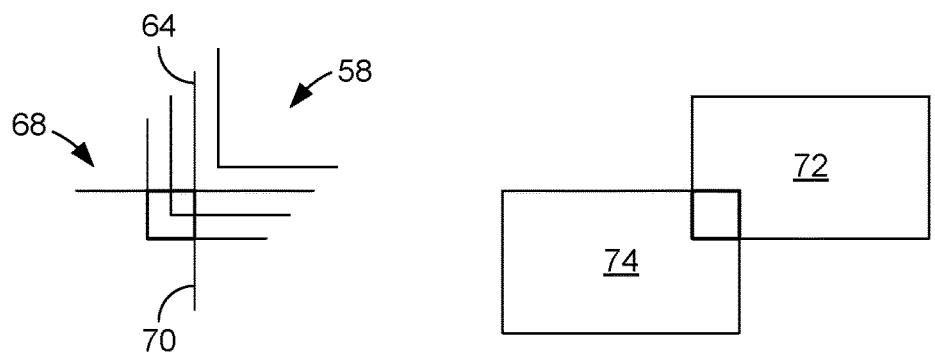
Figure 6C:
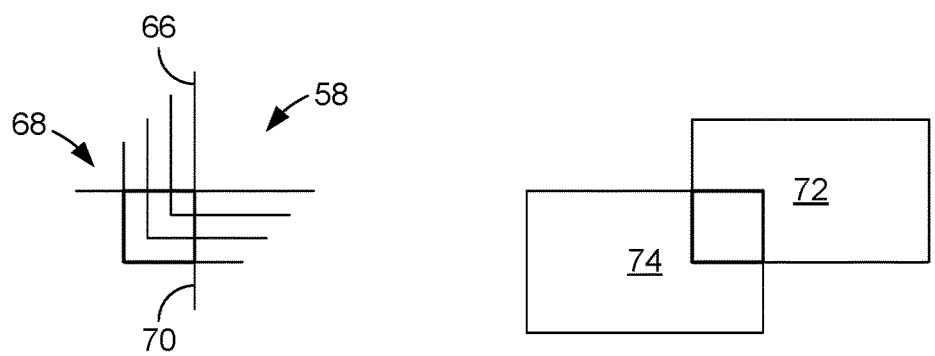

The alignment marks 58 and 68 can be used to control the overlap between different layers of a device. FIGS. 6A-6C show an example of this. As indicated in FIG. 6A, the first and second masks have been aligned so that the corner marker 70 of the alignment mark 68 aligns with the second corner marker 62 of the alignment mark 58. With this configuration, a relatively small amount of overlap between two layers 72 and 74 will be formed.

Referring to next FIG. 6B, the masks have been aligned so that the corner marker 70 of the alignment mark 68 aligns with the third corner marker 64 of the alignment mark 58. With this configuration, a larger amount of overlap between two layers 72 and 74 results.

Finally, with reference to FIG. 6C, the masks have been aligned so that the corner marker 70 of the alignment mark 68 aligns with the fourth corner marker 66 of the alignment mark 58. With this configuration, a still larger amount of overlap between two layers 72 and 74 results.

In some embodiments, the alignment between two or more photomasks can be changed for different wafers to form devices having different current densities from wafer to wafer. In other embodiments, the alignment can be changed for different dies on the same wafer to form devices having different current densities on the same wafer.

Figure 7:
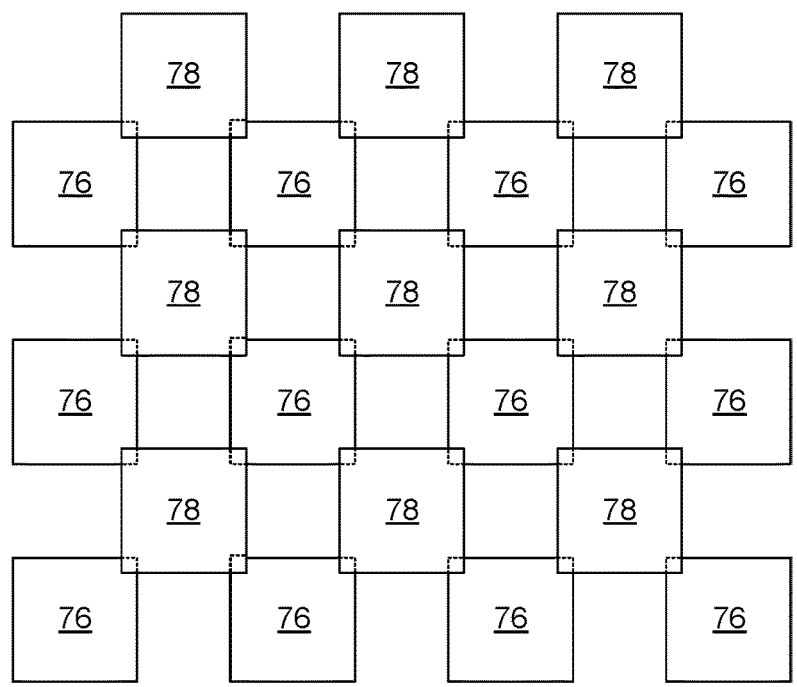
FIG. 7 is a first example circuit that can be formed using the masks of FIG. 5.
Figure 8:
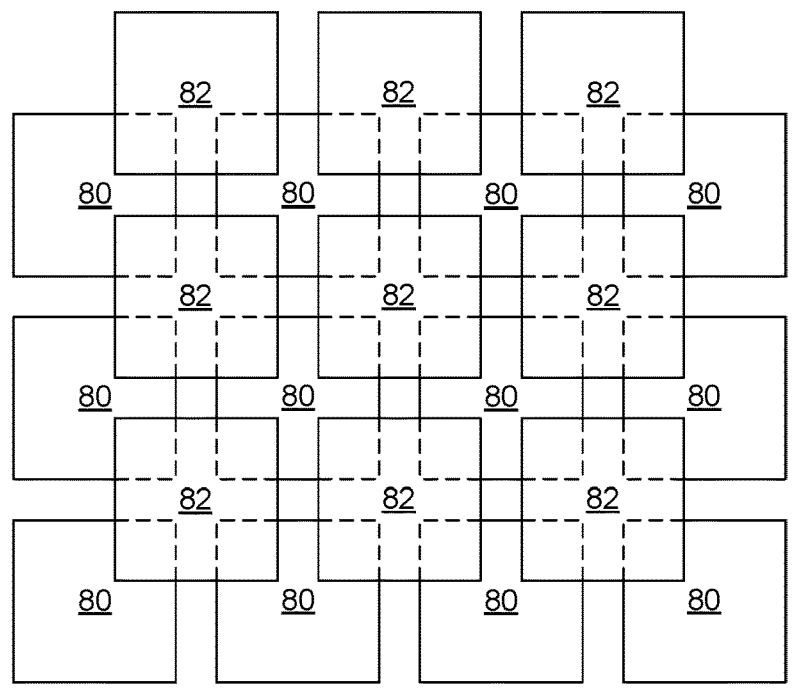
FIG. 8 is a second example circuit that can be formed using the masks of FIG. 5.

FIGS. 7 and 8 show example arrays of devices (e.g., MIM devices) that can be formed using the above-described alignment method. In FIG. 7, an array of first layers 76 is formed on a substrate using a first photomask and an array of second layers 78 is formed over the first array using a second photomask. As indicated in the figure, the second layers 78 overlap the first layers 76 to a relatively small degree. In FIG. 8, an array of first layers 80 is formed on a substrate using a first photomask and an array of second layers 82 are formed over the first layers using a second photomask. In this example, however, the second layers overlap the first layers to a much larger degree. In some embodiments, such arrays can be used as sensors. For example, the devices can be immersed in a fluid (gas or liquid) and the electrical properties of the device, such as resistance or capacitance, can be observed to determine the effect of the fluid on the properties as a means of detecting the presence or concentration of a substance. In such an application, different current densities resulting from different degrees of overlap can be used to adjust the sensing frequency.

Although the above discussion has focused on MIM devices, the disclosed methods can be used in conjunction with other devices, such as metal-insulator-semiconductor devices.

The invention claimed is:

1. A method for fabricating thin film tunneling devices using a mask set, the method comprising:
   depositing a first layer of material on a substrate;
   positioning a first photomask over the substrate;
   exposing the first layer to light that passes through the first photomask;
   depositing a second layer of material on the substrate;
   positioning a second photomask over the substrate by aligning a corner marker provided on the second photomask with one of multiple corner markers provided on the first photomask, wherein the corner marker of the first photomask with which the corner marker of the second photomask aligns defines a degree of overlap between a first structure formed using the first photomask and a second structure formed using the second photomask; and
   exposing the second layer to light that passes through the second photomask.

2. The method of claim 1, wherein the photomasks are made of a transparent material.

3. The method of claim 1, wherein the photomasks comprise glass plates.

4. The method of claim 1, wherein the photomasks each include an opaque layer having a pattern that defines the shapes of the first and second layers.

5. The method of claim 1, wherein the opaque layers are made of chrome.

6. The method of claim 1, wherein each corner marker comprises a first line that extends from a point on its photomask and a second line that extends from the point in a direction 90 degrees out of phase with the first line.

7. The method of claim 6, wherein the corner markers of the first photomask are spaced from each other along a 45 degree diagonal direction along the first photomask.

8. The method of claim 1, wherein the corner marker of the second photomask is rotated 180 degrees relative to the corner markers of the first photomask.

\* \* \* \* \*